United States Patent [19]
Ursel et al.

[11] Patent Number: 6,092,812
[45] Date of Patent: Jul. 25, 2000

[54] WATER-TIGHT PLASTIC COMPONENT

[75] Inventors: Eckhard Ursel, Buehl; Stefan Freund, Gaggenau, both of Germany

[73] Assignee: Robert Bosch GmbH, Stuttgart, Germany

[21] Appl. No.: 09/125,427

[22] PCT Filed: Oct. 18, 1997

[86] PCT No.: PCT/DE97/02408

§ 371 Date: Aug. 19, 1998

§ 102(e) Date: Aug. 19, 1998

[87] PCT Pub. No.: WO98/27370

PCT Pub. Date: Jun. 25, 1998

[30] Foreign Application Priority Data

Dec. 19, 1996 [DE]  Germany .......................... 196 52 926

[51] Int. Cl.[7] .......................... F16J 15/10; B01D 53/22; B29B 13/00
[52] U.S. Cl. .................. 277/630; 264/263; 96/6; 277/634; 277/637
[58] Field of Search ...................... 277/628, 630, 277/634, 637, 603, 616, 910; 264/263, 271.1, 273, 274; 96/6, 155

[56] References Cited

U.S. PATENT DOCUMENTS

| | | | |
|---|---|---|---|
| 3,891,290 | 6/1975 | Marshall | 339/15 |
| 3,924,979 | 12/1975 | Rose | 418/142 |
| 4,853,013 | 8/1989 | Rio et al. | 55/159 |
| 4,863,499 | 9/1989 | Osendorf | 55/316 |
| 5,066,344 | 11/1991 | Inami et al. | 156/138 |
| 5,558,346 | 9/1996 | Hartery | 277/189 |
| 5,736,045 | 4/1998 | Bies et al. | 210/497.01 |
| 5,785,390 | 7/1998 | Gold et al. | 301/108.1 |

*Primary Examiner*—Anthony Knight
*Assistant Examiner*—Vishal Patel
*Attorney, Agent, or Firm*—Ronald E. Greigg; Edwin E. Greigg

[57] ABSTRACT

A water-tight plastic component, with a ventilation opening for air exchange between the component interior and the component exterior, and with a gas permeable membrane that covers the ventilation opening to prevent the entry of water into the component interior. The membrane is inserted in a cup-shaped recess disposed in front of the mouth of the ventilation opening, and is clamped at the edge, together with a sealing ring, against the bottom of the recess, in order to achieve a simple assembly. The sealing ring and membrane edge are overlapped by segment tabs that are disposed axially spaced from the bottom of the recess and protrude radially from the cylinder wall of the recess, forming an undercut.

12 Claims, 2 Drawing Sheets

WATER-TIGHT PLASTIC COMPONENT

PRIOR ART

The invention is based on a water-tight plastic component, in particular a plastic housing.

In a known plastic component (WO 88/09422), which is embodied as a drive housing for an electric drive device for adjusting a cover element for an opening in the body of a motor vehicle, such as a window or sunroof or the like, the membrane inserted into the cup-like housing recess is secured by a dish-shaped spring element, which engages in the cylinder wall of the housing recess after the fashion of a so-called speed nut securing mechanism. A seal embodied as an O-ring is inserted between the membrane edge and the spring element and is clamped by the spring element together with the membrane edge against an annular support shoulder that is situated immediately in front of the bottom of the housing recess.

ADVANTAGES OF THE INVENTION

The water-tight plastic component the has an advantage that the membrane with the sealing ring is simply pressed into the undercuts of the segment tabs and is reliably secured there while sealing the membrane in relation to the cylinder wall of the housing recess. As a result, the spring element is no longer necessary, which contributes to a reduction in costs.

Advantageous improvements and updates of the water-tight plastic component are possible by means of the measures taken herein.

According to an advantageous embodiment of the invention, the segment tabs are offset from one another by equal angles of rotation over the inner circumference of the cylindrical inner wall of the housing recess and are formed directly with the component when it is injection molded. The undercuts of the segment tabs, i.e. the free space between the segment laps and the bottom or is base of the cup-shaped housing recess, are constituted by means of rotating removal from the mold of an inner die part of a two-part inner forming die, whose outer die part concentrically encloses the inner die part and must be previously withdrawn from it axially. By means of these measures, the plastic component can be ready made in a single injection molding process and needs no additional material-removing finishing procedures.

BRIEF DESCRIPTION OF THE DRAWINGS

The invention will be explained in more detail in the description below in conjunction with an exemplary embodiment depicted in the drawings.

DESCRIPTION OF THE EXEMPLARY EMBODIMENT

Figure 1:
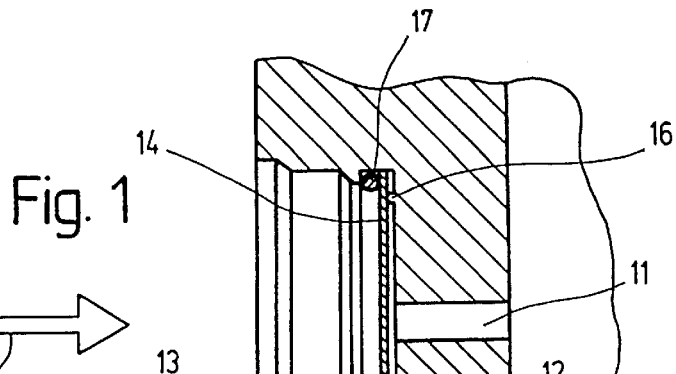
FIG. 1 shows a detail of a longitudinal section through a plastic component embodied as a housing.
Figure 2:
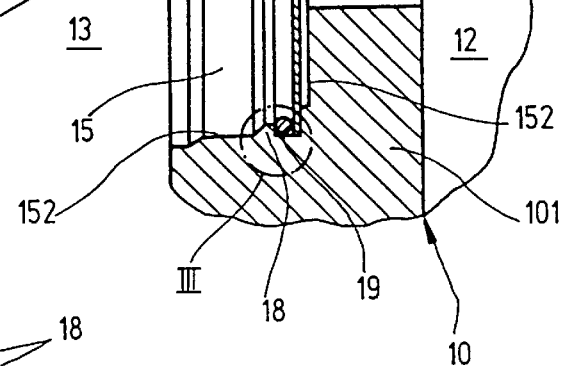
FIG. 2 is a view of the housing detail in the direction of arrow II in FIG. 1.
Figure 3:
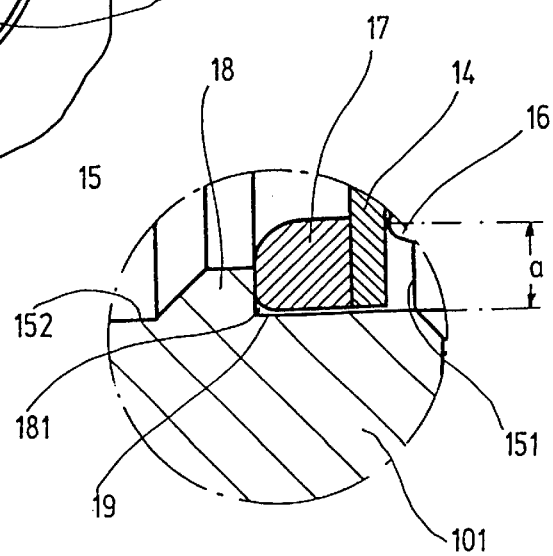
FIG. 3 is an enlarged depiction of the detail III in FIG. 1.

The plastic housing 10, a detail of which is represented in a longitudinal section in FIG. 1, as an example for a general water-tight plastic component, has a ventilation opening 11 for air exchange between the housing interior 12 and the housing exterior 13, and this opening is covered with a gas permeable membrane 14 to prevent the entry of water into the housing interior 12. Coaxial to the ventilation opening 11, a step-shouldered, cup-shaped recess 15 is let into the housing wall 101 from the outside and the ventilation opening 11 feeds into its bottom 151. An annular rib 16 concentric to the mouth of the feed opening 11 is embodied at the bottom 151 of the recess 15 and maintains a radial distance a from the outer circumference of the bottom 151 (FIG. 3). The membrane 14 is placed on this annular rib 16 that protrudes axially from the bottom 151 of the recess 15, and by means of a sealing ring 17 placed on the edge of the membrane 14, is sealed in a water-tight manner in relation to the cylinder wall 152 of the recess 15. In an alternative embodiment, the sealing ring 17 can also be formed onto the membrane 14 in one piece with it. The fixing of the membrane 14 with the sealing ring 17 is carried out by means of segment tabs 18 that protrude radially from the cylinder wall 152 of the recess 15, spaced axially from the bottom 151 of the recess 15 to form undercuts 19, and these tabs overlap the sealing ring 17. The axial spacing of the segment tabs 18 from the bottom 151 of the recess 15 is chosen so that it corresponds approximately to the sum of the axial thicknesses of the membrane 14 and the sealing ring 17 so that they can be pressed between the annular rib 16 and the segment tabs 18 and are reliably fixed there. As shown in FIG. 2, the segment tabs 18 are offset from one another by equal circumference angles over the circumference of the cylinder wall 152 of the recess 15.

Figure 4:
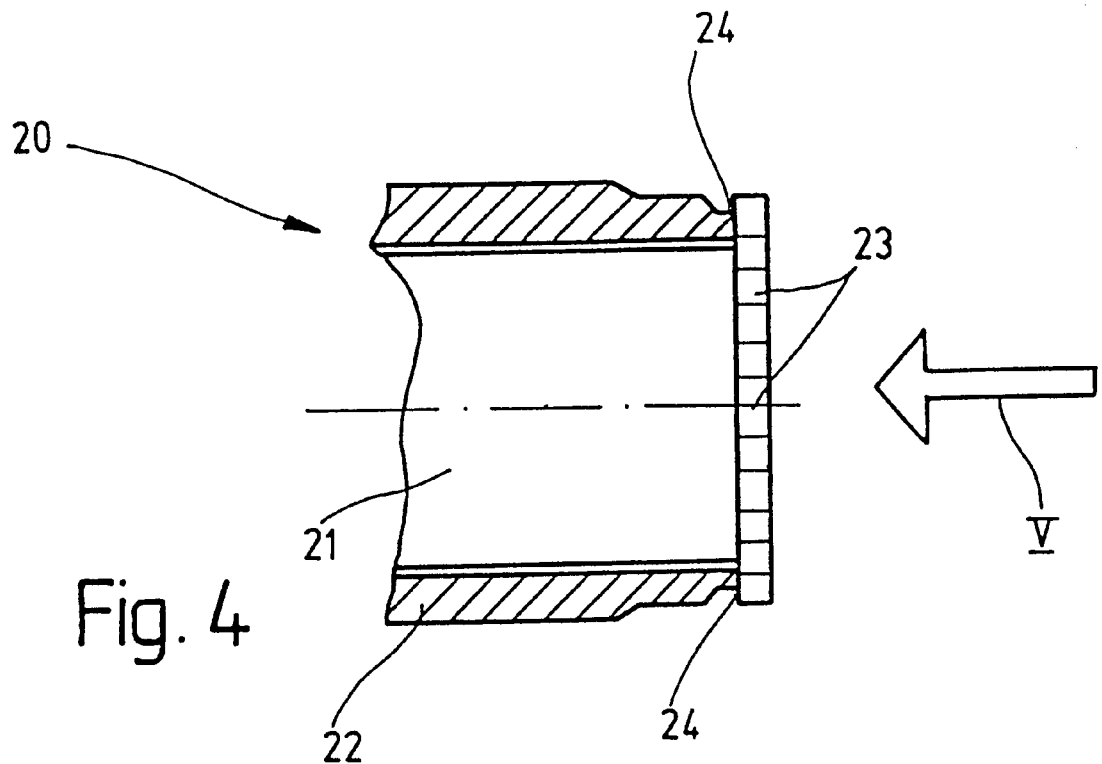
FIG. 4 shows a detail of a longitudinal section through a two-part inner forming die for injection molding the plastic housing.
Figure 5:
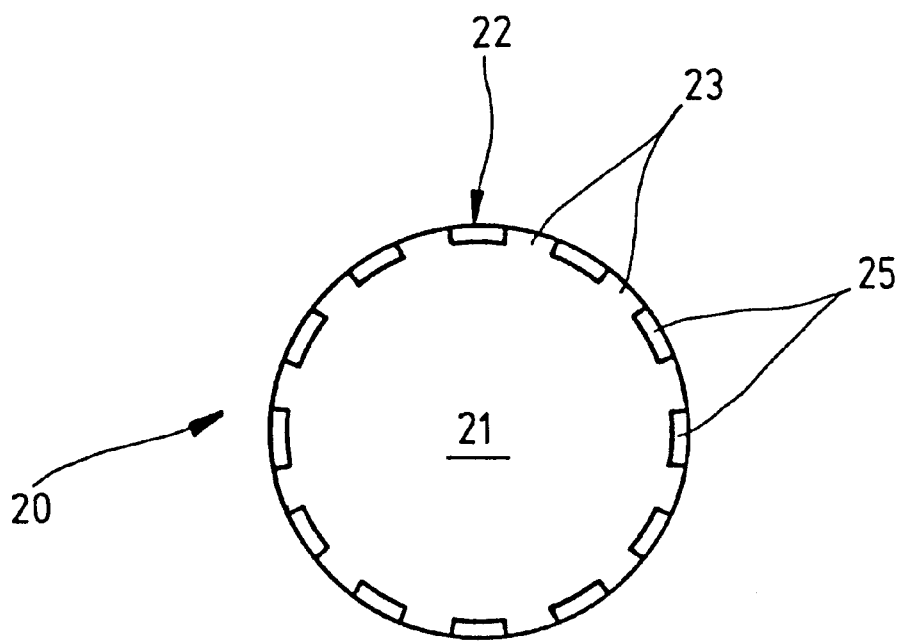
FIG. 5 is a view of the inner forming die in the direction V in FIG. 4.

The segment tabs 18 are formed directly with the manufacture of the plastic housing 10 that is embodied as an injection molded part, with a simultaneous formation of the ventilation opening 11. A two-part inner forming die 20, a detail of which is shown in FIG. 4, is necessary to embody the ventilation opening 11 during the plastic injection molding of the housing 10. This two-part inner forming die 20 has an inner die part 21 and an outer die part 22 coaxially encompassing it. On its one end face, the inner die part 21 has annular segments 23 extending radially outward whose dimensions in the plane crosswise to the die axis correspond to the dimensions of the radial segment tabs 18 in the recess 15 and are distributed over the circumference of the die part 21 in relation to one another by the same angle of rotation as the segment tabs 18, and their axial height corresponds to the distance between the undercut face 181 of the segment tabs 18 and the bottom 151 of the recess 15, i.e. the axial depth of the undercut 19. The outer die part 22, with its outer circumferential structure, is modeled after the step-shouldered cylinder wall 152 of the cup-shaped recess 15 and in order to form the segment tabs 18 in the injection molding process, has end face recesses 24 that have the same dimensions as the segment tabs and the annular segments 23 flush with them on the inner die part 21. Between these recesses 24 let in from the end face of the outer die part 22, claws 25 remain, which pass with positive fit between the annular segments 23 on the inner die part 21 and end axially flush with the annular segments 23.

In order to mold the recess 15, the two-part inner forming die 20 described is inserted into the injection molding form together with another coaxial inner forming die for molding the ventilation opening 11. After the filling of the plastic material, which flows into the hollow spaces remaining between the annular segments 23 on the inner die part 21 and the recesses 24 axially flush with them in the outer die part 22, and as a result, forms the segment tabs 18, and after its solidification, the removal from the mold is carried out, wherein first, the outer die part 22 is withdrawn axially from the inner die part 21 and then the removal of the inner die part 21 from the mold is carried out first by rotation around an angle of rotation, which corresponds to the spacing angle of the annular segments 23 from one another, and then by axial withdrawal of the inner die part 21.

The foregoing relates to a preferred exemplary embodiment of the invention, it being understood that other variants and embodiments thereof are possible within the spirit and scope of the invention, the latter being defined by the appended claims.

What is claimed is:

1. A water-tight plastic component, which comprises a ventilation opening (11) for air exchange between a component interior (12) and a component exterior (13), a gas permeable membrane (14) that covers the ventilation opening (11) to prevent an entry of water into the component interior (12) through the ventilation opening (11), said permeable membrane is inserted in a cup-shaped recess (15) disposed in front of a mouth of the ventilation opening (11), and is clamped at a membrane edge, together with a sealing ring (17), against a bottom (151) of the recess (15), the sealing ring (17) and the membrane edge are overlapped by segment tabs (18), said segment tabs are disposed at an axial distance from the bottom (151) of the recess (15) and protrude radially from a cylinder wall (152) of the recess (15), thereby forming undercuts (19).

2. The component according to claim 1, in which the axial spacing of the undercut faces (181) of the segment tabs (18) corresponds approximately to a sum of an axial thicknesses of the membrane edge and the sealing ring (17).

3. The component according to claim 1, in which the sealing ring and the membrane are formed as a unitary piece.

4. The component according to claim 1, in which the segment tabs (18) are offset from one another over the inner circumference of the cylinder wall (152) of the recess (15) by equal angles of rotation and are formed directly with the injection molding of the component.

5. The component according to claim 4, in which the undercuts (19) of the segment tabs (18) are formed by means of rotating and removal from the mold of an inner die part (21) of a two-part inner forming die (20), whose outer die part (22) concentrically encloses the inner die part (21) and must be previously withdrawn from it axially.

6. The component according to claim 2, in which the sealing ring (17) is formed onto the membrane edge in one piece with the membrane.

7. The component according to claim 2, in which the segment tabs (18) are offset from one another over the inner circumference of the cylinder wall (152) of the recess (15) by equal angles of rotation and are formed directly with the injection molding of the component.

8. The component according to claim 3, in which the segment tabs (18) are offset from one another over the inner circumference of the cylinder wall (152) of the recess (15) by equal angles of rotation and are formed directly with the injection molding of the component.

9. The component according to claim 6, in which the segment tabs (18) are offset from one another over the inner circumference of the cylinder wall (152) of the recess (15) by equal angles of rotation and are formed directly with the injection molding of the component.

10. The component according to claim 7, in which the undercuts (19) of the segment tabs (18) are formed by means of rotating and removal from the mold of an inner die part (21) of a two-part inner forming die (20), whose outer die part (22) concentrically encloses the inner die part (21) and must be previously withdrawn from it axially.

11. The component according to claim 8, in which the undercuts (19) of the segment tabs (18) are formed by means of rotating and removal from the mold of an inner die part (21) of a two-part inner forming die (20), whose outer die part (22) concentrically encloses the inner die part (21) and must be previously withdrawn from it axially.

12. The component according to claim 9, in which the undercuts (19) of the segment tabs (18) are formed by means of rotating and removal from the mold of an inner die part (21) of a two-part inner forming die (20), whose outer die part (22) concentrically encloses the inner die part (21) and must be previously withdrawn from it axially.

* * * * *